United States Patent
Liu et al.

(10) Patent No.: US 11,340,271 B2
(45) Date of Patent: May 24, 2022

(54) FORCED OSCILLATION SOURCE LOCATION DETERMINATION BASED ON OSCILLATION MODE ANGLE ANALYSIS USING SYNCHROPHASOR DATA

(71) Applicant: University of Tennessee Research Foundation, Knoxville, TN (US)

(72) Inventors: Yilu Liu, Knoxville, TN (US); Weikang Wang, Knoxville, TN (US); Wenpeng Yu, Knoxville, TN (US); Chujie Zeng, Knoxville, TN (US); Lin Zhu, Knoxville, TN (US)

(73) Assignee: UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 0 days.

(21) Appl. No.: 16/947,410

(22) Filed: Jul. 31, 2020

(65) Prior Publication Data
US 2022/0034947 A1     Feb. 3, 2022

(51) Int. Cl.
  *G01R 19/25* (2006.01)
  *G01R 29/18* (2006.01)
  *H02J 3/24* (2006.01)

(52) U.S. Cl.
  CPC ......... *G01R 19/2513* (2013.01); *G01R 29/18* (2013.01); *H02J 3/24* (2013.01)

(58) Field of Classification Search
  None
  See application file for complete search history.

(56) References Cited

U.S. PATENT DOCUMENTS

2018/0054063 A1* 2/2018 Parashar ............... H02J 3/382

OTHER PUBLICATIONS

Feng et al. ("The Two-Level Forced Oscillations Source Locations Method Based on Phasor and Energy Analysis," IEEE Access, 2018, pp. 1-10) (Year: 2018).*
NASPI (Phase Angle Calculations: Considerations and Use Cases, NASPI Engineering Analysis Task Team Technical Paper, Sep. 2016). (Year: 2016).*

\* cited by examiner

*Primary Examiner* — Roy Y Yi
(74) *Attorney, Agent, or Firm* — Myers Bigel, P.A.

(57) ABSTRACT

A method includes performing by a processor: receiving a plurality of synchrophasor measurements of a power system signal associated with a time interval from a plurality of phasor measurement units (PMUs), respectively, each of the plurality of synchrophasor measurements including a phase angle, frequency value, and a timestamp associated with the synchrophasor measurement; determining, for each of the plurality of PMUs, a dominant mode frequency of a forced oscillation signal component of the power system signal based on the frequency value and the phase angle; determining, for each of the plurality of PMUs, a mode angle of the forced oscillation signal component at the dominant mode frequency; and determining a geographic forced oscillation source location for a source of the forced oscillation signal component based on the plurality of mode angles associated with each of the plurality of PMUs, respectively, and geographic locations of the plurality of PMUs.

17 Claims, 11 Drawing Sheets

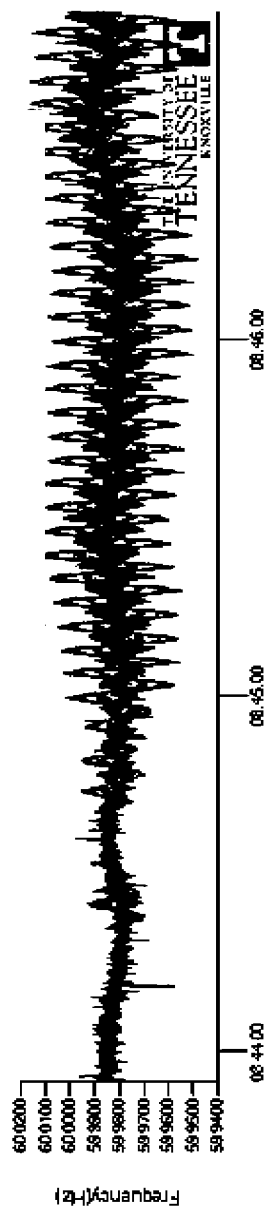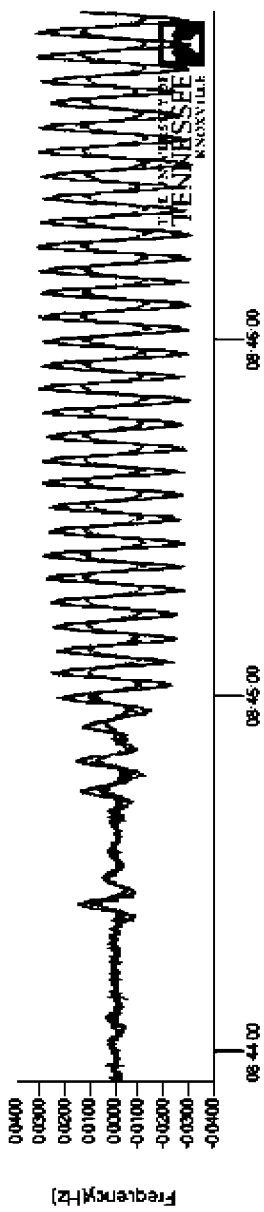

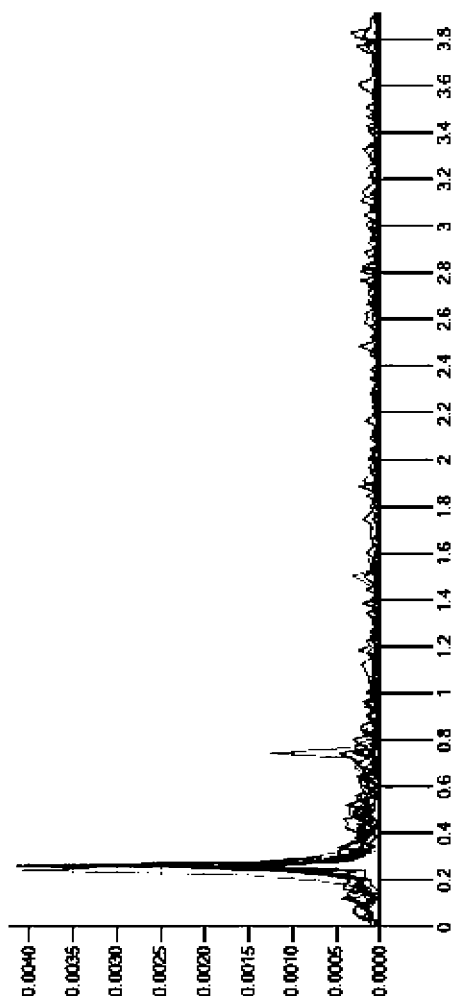

FORCED OSCILLATION SOURCE LOCATION DETERMINATION BASED ON OSCILLATION MODE ANGLE ANALYSIS USING SYNCHROPHASOR DATA

STATEMENT REGARDING FEDERALLY SPONSORED RESEARCH OR DEVELOPMENT

This invention was made with government support under contract number NSF EEC-1041877 awarded by the National Science Foundation. The government has certain rights in the invention.

BACKGROUND

The present disclosure relates to power systems, and, in particular, to monitoring, operation, and control of power systems.

Modern power systems are progressively interconnected and interactive with renewable energy resources. This relationship may post more challenges to a power system in term of inter-area oscillations. Besides the conventional poorly damped oscillations, there may also be forced oscillations caused by periodic disturbances or faults. A "forced oscillation" refers to a type of system response to a periodic disturbance, which could be caused by prime mover pressure pulsation, malfunction of a power system stabilizer, periodic load disturbances, etc. Small periodic inputs may result in system resonance at a much larger magnitude, especially when the mode of input is coincidently nearby the system mode. However, forced oscillations may terminate immediately once the disturbances are withdrawn, which may make determining the location of a source of a forced oscillation difficult. Nevertheless, determining the location of the source of a forced oscillation may be a key piece of information used to investigate and resolve or take correction action for the event.

SUMMARY

In some embodiments of the inventive concept, a method comprises performing by a processor: receiving a plurality of synchrophasor measurements of a power system signal associated with a time interval from a plurality of phasor measurement units (PMUs), respectively, each of the plurality of synchrophasor measurements including a phase angle, frequency value, and a timestamp associated with the synchrophasor measurement; determining, for each of the plurality of PMUs, a dominant mode frequency of a forced oscillation signal component of the power system signal based on the frequency value and the phase angle; determining, for each of the plurality of PMUs, a mode angle of the forced oscillation signal component at the dominant mode frequency; and determining a geographic forced oscillation source location for a source of the forced oscillation signal component based on the plurality of mode angles associated with each of the plurality of PMUs, respectively, and geographic locations of the plurality of PMUs.

In other embodiments, determining the geographic forced oscillation source location comprises: identifying one of the plurality of PMUs that has a most leading mode angle associated therewith relative to other ones of the plurality of PMUs; selecting a subset of the plurality of PMUs, the subset of the plurality of PMUs comprising the one of the plurality of PMUs that has the most leading mode angle and ones of the plurality of PMUs that are in geographic proximity to the one of the plurality of PMUs that has the most leading mode angle; performing a least squares regression analysis on the geographic locations of the subset of the plurality of PMUs, the mode angles associated with each of the subset of the plurality of PMUs, and a rate of change of the mode angle with distance; and determining the geographic forced oscillation source location based on the least squares regression analysis.

In still other embodiments, the method further comprises subtracting a system median frequency value from the frequency value in each of the plurality of synchrophasor measurements to generate a detrended frequency value. Determining the dominant mode frequency of the forced oscillation signal component of the power system signal comprises: determining, for each of the plurality of PMUs, the dominant mode frequency of a forced oscillation signal component of the power system signal based on the detrended frequency value and the phase angle.

In still other embodiments, the method further comprises performing a Fourier analysis on the detrended frequency value power system signal component for each of the plurality of synchrophasor measurements. Determining the dominant mode frequency of the forced oscillation signal component of the power system signal comprises: determining, for each of the plurality of PMUs, the dominant mode frequency of the forced oscillation signal component of the power system signal based on the Fourier analysis.

In still other embodiments, magnitudes of the forced oscillation signal components are greatest for a majority of ones of the plurality of PMUs at the dominant mode frequency.

In still other embodiments, the method further comprises unwrapping, for each of the plurality of PMUs, the mode angle of the forced oscillation signal component at the dominant mode frequency to generate an unwrapped mode angle. Determining the geographic forced oscillation source location for the source of the forced oscillation signal component comprises: determining the geographic forced oscillation source location for a source of the forced oscillation signal component based on the plurality of unwrapped mode angles associated with each of the plurality of PMUs, respectively, and geographic locations of the plurality of PMUs.

In still other embodiments, unwrapping, for each of the plurality of PMUs, the mode angle of the forced oscillation signal component comprises: maintaining mode angle continuity of the plurality of mode angles associated with each of the plurality of PMUs.

In still other embodiments, unwrapping, for each of the plurality of PMUs, the mode angle of the forced oscillation signal component at the dominant mode frequency to generate the unwrapped mode angle comprises: setting, for each of the plurality of PMUs for which the associated mode angle is a value between $\pi$ and $2\pi$, the unwrapped mode angle to a value between 0 and $-\pi$ corresponding to the value between $\pi$ and $2\pi$.

In some embodiments of the inventive concept, a system comprises a processor; and a memory coupled to the processor and comprising computer readable program code embodied in the memory that is executable by the processor to perform operations comprising: receiving a plurality of synchrophasor measurements of a power system signal associated with a time interval from a plurality of phasor measurement units (PMUs), respectively, each of the plurality of synchrophasor measurements including a phase angle, frequency value, and a timestamp associated with the synchrophasor measurement; determining, for each of the plurality of PMUs, a dominant mode frequency of a forced oscillation signal component of the power system signal based on the frequency value and the phase angle; determining, for each of the plurality of PMUs, a mode angle of the forced oscillation signal component at the dominant mode frequency; and determining a geographic forced oscillation source location for a source of the forced oscillation signal component based on the plurality of mode angles associated with each of the plurality of PMUs, respectively, and geographic locations of the plurality of PMUs.

In further embodiments, determining the geographic forced oscillation source location comprises: identifying one of the plurality of PMUs that has a most leading mode angle associated therewith relative to other ones of the plurality of PMUs; selecting a subset of the plurality of PMUs, the subset of the plurality of PMUs comprising the one of the plurality of PMUs that has the most leading mode angle and ones of the plurality of PMUs that are in geographic proximity to the one of the plurality of PMUs that has the most leading mode angle; performing a least squares regression analysis on the geographic locations of the subset of the plurality of PMUs, the mode angles associated with each of the subset of the plurality of PMUs, and a rate of change of the mode angle with distance; and determining the geographic forced oscillation source location based on the least squares regression analysis.

In still further embodiments, the operations further comprise: subtracting a system median frequency value from the frequency value in each of the plurality of synchrophasor measurements to generate a detrended frequency value. Determining the dominant mode frequency of the forced oscillation signal component of the power system signal comprises: determining, for each of the plurality of PMUs, the dominant mode frequency of a forced oscillation signal component of the power system signal based on the detrended frequency value and the phase angle.

In still further embodiments, the operations further comprise: performing a Fourier analysis on the detrended frequency value power system signal component for each of the plurality of synchrophasor measurements. Determining the dominant mode frequency of the forced oscillation signal component of the power system signal comprises: determining, for each of the plurality of PMUs, the dominant mode frequency of the forced oscillation signal component of the power system signal based on the Fourier analysis.

In still further embodiments, magnitudes of the forced oscillation signal components are greatest for a majority of ones of the plurality of PMUs at the dominant mode frequency.

In still further embodiments, the operations further comprise: unwrapping, for each of the plurality of PMUs, the mode angle of the forced oscillation signal component at the dominant mode frequency to generate an unwrapped mode angle. Determining the geographic forced oscillation source location for the source of the forced oscillation signal component comprises: determining the geographic forced oscillation source location for a source of the forced oscillation signal component based on the plurality of unwrapped mode angles associated with each of the plurality of PMUs, respectively, and geographic locations of the plurality of PMUs.

In some embodiments of the inventive concept, a computer program product comprises a non-transitory computer readable storage medium comprising computer readable program code embodied in the medium that is executable by a processor to perform operations comprising: receiving a plurality of synchrophasor measurements of a power system signal associated with a time interval from a plurality of phasor measurement units (PMUs), respectively, each of the plurality of synchrophasor measurements including a phase angle, frequency value, and a timestamp associated with the synchrophasor measurement; determining, for each of the plurality of PMUs, a dominant mode frequency of a forced oscillation signal component of the power system signal based on the frequency value and the phase angle; determining, for each of the plurality of PMUs, a mode angle of the forced oscillation signal component at the dominant mode frequency; and determining a geographic forced oscillation source location for a source of the forced oscillation signal component based on the plurality of mode angles associated with each of the plurality of PMUs, respectively, and geographic locations of the plurality of PMUs.

In other embodiments, determining the geographic forced oscillation source location comprises: identifying one of the plurality of PMUs that has a most leading mode angle associated therewith relative to other ones of the plurality of PMUs; selecting a subset of the plurality of PMUs, the subset of the plurality of PMUs comprising the one of the plurality of PMUs that has the most leading mode angle and ones of the plurality of PMUs that are in geographic proximity to the one of the plurality of PMUs that has the most leading mode angle; performing a least squares regression analysis on the geographic locations of the subset of the plurality of PMUs, the mode angles associated with each of the subset of the plurality of PMUs, and a rate of change of the mode angle with distance; and determining the geographic forced oscillation source location based on the least squares regression analysis.

In still other embodiments, the operations further comprise: subtracting a system median frequency value from the frequency value in each of the plurality of synchrophasor measurements to generate a detrended frequency value. Determining the dominant mode frequency of the forced oscillation signal component of the power system signal comprises: determining, for each of the plurality of PMUs, the dominant mode frequency of a forced oscillation signal component of the power system signal based on the detrended frequency value and the phase angle.

In still other embodiments, the operations further comprise: performing a Fourier analysis on the detrended frequency value power system signal component for each of the plurality of synchrophasor measurements. Determining the dominant mode frequency of the forced oscillation signal component of the power system signal comprises: determining, for each of the plurality of PMUs, the dominant mode frequency of the forced oscillation signal component of the power system signal based on the Fourier analysis.

In still other embodiments, magnitudes of the forced oscillation signal components are greatest for a majority of ones of the plurality of PMUs at the dominant mode frequency.

In still other embodiments, the operations further comprise unwrapping, for each of the plurality of PMUs, the mode angle of the forced oscillation signal component at the dominant mode frequency to generate an unwrapped mode angle. Determining the geographic forced oscillation source location for the source of the forced oscillation signal component comprises: determining the geographic forced oscillation source location for a source of the forced oscillation signal component based on the plurality of unwrapped mode angles associated with each of the plurality of PMUs, respectively, and geographic locations of the plurality of PMUs.

Other methods, systems, articles of manufacture, and/or computer program products, according to embodiments of the inventive concept, will be or become apparent to one with skill in the art upon review of the following drawings and detailed description. It is intended that all such additional systems, methods, articles of manufacture, and/or computer program products be included within this description, be within the scope of the present inventive concept, and be protected by the accompanying claims.

BRIEF DESCRIPTION OF THE DRAWINGS

Other features of embodiments will be more readily understood from the following detailed description of specific embodiments thereof when read in conjunction with the accompanying drawings, in which:

FIGS. 9A and 9B are graphs that illustrate detrending operations on the forced oscillation signal component of a power signal in accordance with some embodiments of the inventive concept;

FIG. 11 is a graph of a Fourier analysis that illustrates the magnitudes of the various frequency harmonics of a forced oscillation signal component of a power signal in accordance with some embodiments of the inventive concept;

DETAILED DESCRIPTION

Figure 1:
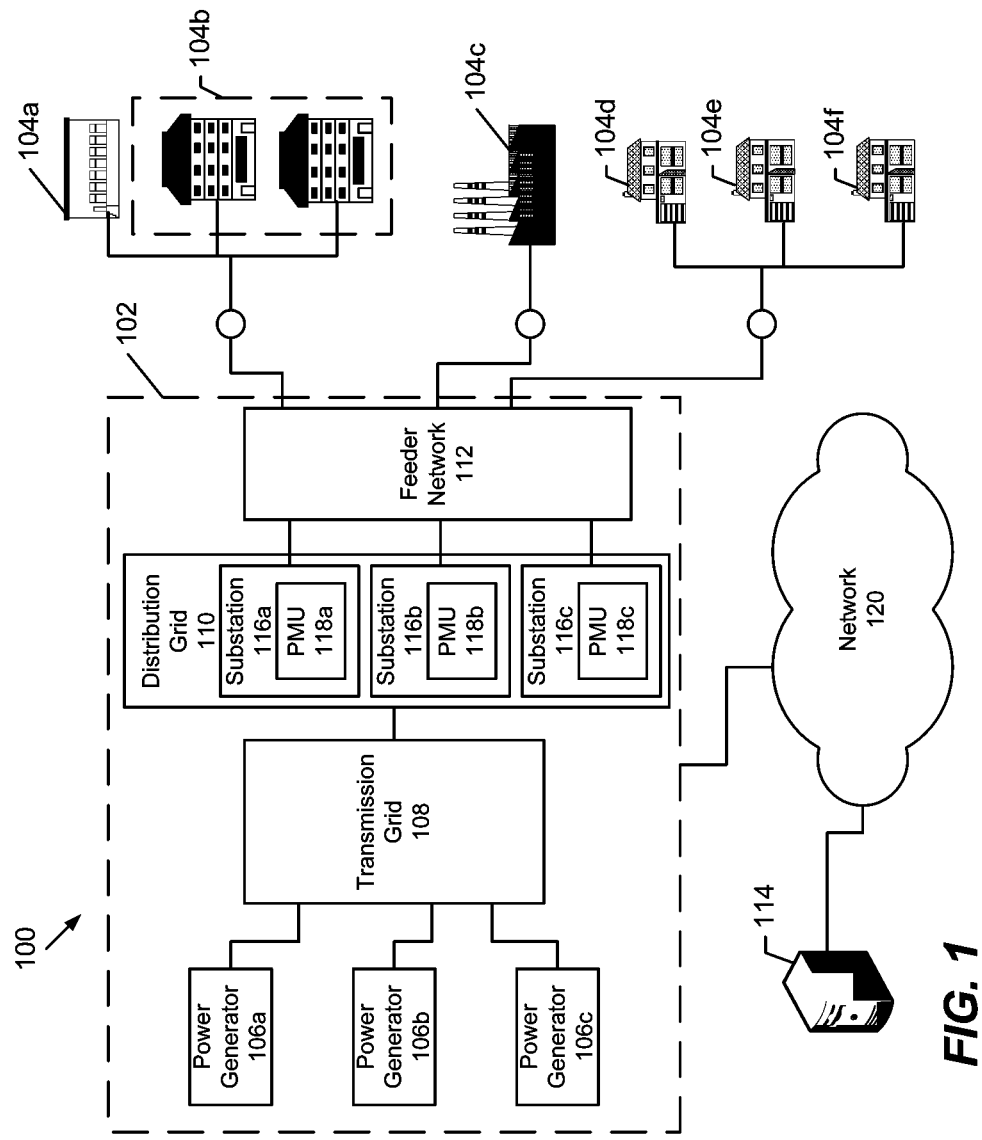
FIG. 1 is a block diagram that illustrates a power distribution network including a forced oscillation source location determination capability in accordance with some embodiments of the inventive concept.

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

As used herein, the term "data processing facility" includes, but it is not limited to, a hardware element, firmware component, and/or software component. A data processing system may be configured with one or more data processing facilities.

Phasor Measurement Units (PMUs) are devices that are used to estimate the magnitude and phase angle of the voltage or current in a power system using a common time source for synchronization. PMUs are increasingly deployed in power systems in to provide synchronized measurements for system situational awareness and observation of behavioral dynamics. The PMUs may be placed in various locations within a power system including the main power grid, the distribution grid, and/or consumer locations. PMUs may be used to collect samples from a waveform in quick succession and to reconstruct the phasor quantity, which is made up of an angle measurement and a magnitude measurement known as a synchrophasor measurement.

Some embodiments of the inventive concept stem from a realization that with expanding deployment of PMUs in the power grid, increased awareness of system dynamics may be made available to system operators. Embodiments of the inventive concept may provide a methodology to locate the geographic source of a forced oscillation event based on the mode angle analysis of the PMUs' measurements. Once a forced oscillation event is detected, the corresponding PMU data may be collected. A Fourier analysis may be performed on the power system signal data collected form the PMUs to determine the dominant mode frequency of the forced oscillation signal component of the power system signal, as well as the mode angle and magnitude of the dominant mode at different geographic areas corresponding to different PMU locations. The mode angle may be unwrapped geographically based on the location of each PMU, and the geographic location with the most leading mode angle may be considered as the source of the forced oscillation event. In some embodiments, the location of the forced oscillation event may be pinpointed even further by performing a least squares regression analysis to the mode angles associated with PMUs in geographic proximity to the PMU associated with the most leading mode angle along with the rate of change of the mode angle with distance.

Referring to FIG. 1, a power system distribution network 100 including a forced oscillation source location determination capability, in accordance with some embodiments of the inventive concept, comprises a main power grid 102, which is typically operated by a public or private utility, and which provides power to various power consumers 104a, 104b, 104c, 104d, 104e, and 104f. The electrical power generators 106a, 106b, and 106c are typically located near a fuel source, at a dam site, and/or at a site often remote from heavily populated areas. The power generators 106a, 106b, and 106c may be nuclear reactors, coal burning plants, hydroelectric plants, and/or other suitable facility for generating bulk electrical power. The power output from the power generators 106, 106b, and 106c is carried via a transmission grid or transmission network over potentially long distances at relatively high voltage levels. A distribution grid 110 may comprise multiple substations 116a, 116b, 116c, which receive the power from the transmission grid 108 and step the power down to a lower voltage level for further distribution. A feeder network 112 distributes the power from the distribution grid 110 substations 116a, 116b, 116c to the power consumers 104a, 104b, 104c, 104d, 104e, and 104f. The power substations 116a, 116b, 116c in the distribution grid 110 may step down the voltage level when providing the power to the power consumers 104a, 104b, 104c, 104d, 104e, and 104f through the feeder network 112.

As shown in FIG. 1, the power consumers 104a, 104b, 104c, 104d, 104e, and 104f may include a variety of types of facilities including, but not limited to, a warehouse 104a, a multi-building office complex 104b, a factory 104c, and residential homes 104d, 104e, and 104f. A feeder circuit may connect a single facility to the main power grid 102 as in the case of the factory 104c or multiple facilities to the main power grid 102 as in the case of the warehouse 104a and office complex 104b and also residential homes 104d, 104e, and 104f. Although only six power consumers are shown in FIG. 1, it will be understood that a feeder network 112 may service hundreds or thousands of power consumers.

The power distribution network 100 further comprises a Distribution Management System (DMS) 114, which may monitor and control the generation and distribution of power via the main power grid 102. The DMS 114 may comprise a collection of processors and/or servers operating in various portions of the main power grid 102 to enable operating personnel to monitor and control the main power grid 102. The DMS 114 may further include other monitoring and/or management systems for use in supervising the main power grid 102. One such system is known as the Supervisory Control and Data Acquisition (SCADA) system, which is a control system architecture that uses computers, networked data communications, and graphical user interfaces for high-level process supervisory management of the main power grid. The DMS 114 may further include a phasor data concentrator module that is configured to manage the reception and processing of synchrophasor measurements from the PMUs 118a, 118b, and 118c. The phasor data concentrator module may cooperate with other supervisory, monitoring, and control modules, systems, and/or capabilities provided via the DMS 114

According to some embodiments of the inventive concept, PMUs 118a, 118b, and 118c may be located at the substations 116a, 116b, and 116c, respectively. PMUs measure current and voltage by amplitude and phase at selected stations of the distribution grid 110. Using, for example, Global Positioning System (GPS) information, the PMUs may be associated with specific geographic locations. Moreover, high-precision time synchronization may allow comparing measured values (synchrophasors) from different substations distant to each other and drawing conclusions regarding the system state and dynamic events, such as power swing conditions, forced oscillation events, and the like. The PMUs 118a, 118b, 118c may determine current and voltage phasors, frequency, and rate of change of frequency and provide these measurements with time stamps for transmittal to the DMS 114 for analysis. The PMUs 118a, 118b, 118c may communicate with the DMS 114 over the network 120. The network 120 may be a global network, such as the Internet or other publicly accessible network. Various elements of the network 120 may be interconnected by a wide area network, a local area network, an Intranet, and/or other private network, which may not be accessible by the general public. Thus, the communication network 120 may represent a combination of public and private networks or a virtual private network (VPN). The network 120 may be a wireless network, a wireline network, or may be a combination of both wireless and wireline networks. Although the PMUs 118a, 118b, and 118c are shown as being located in the substations 116a, 116b, and 116c, it will be understood that the PMUs may be located in other locations within the distribution grid 110, within the main power grid 102, or even at consumer locations 104a, 104b, 104c, 104d, 104e, and 104f, such as, for example, in proximity to wall outlets or other power access points.

Although FIG. 1 illustrates an exemplary a power distribution network 100 including a forced oscillation source location determination capability, it will be understood that embodiments of the inventive concept are not limited to such configurations, but are intended to encompass any configuration capable of carrying out the operations described herein.

Figure 2:
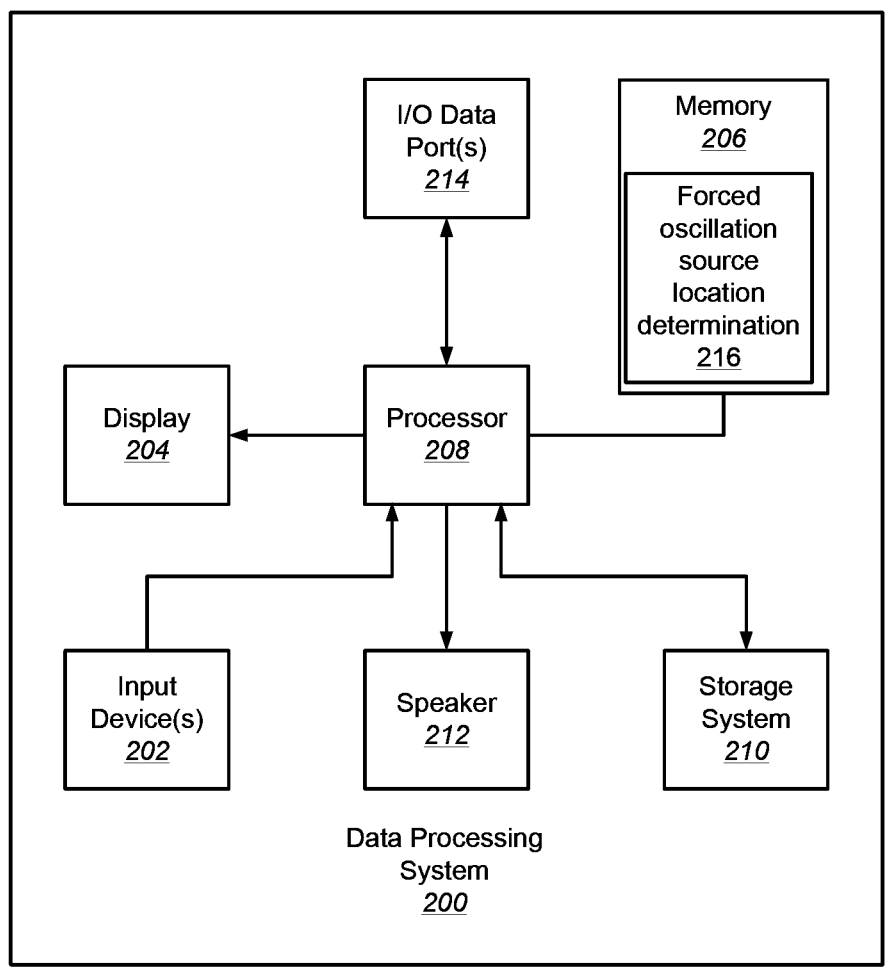
FIG. 2 illustrates a data processing system that may be used to implement a Distribution Management System (DMS) processor associated with a power system of FIG. 1 in accordance with some embodiments of the inventive concept.

Referring now to FIG. 2, a data processing system 200 that may be used to implement the DMS 114 processor of FIG. 1, in accordance with some embodiments of the inventive concept, comprises input device(s) 202, such as a keyboard or keypad, a display 204, and a memory 206 that communicate with a processor 208. The data processing system 200 may further include a storage system 210, a speaker 212, and an input/output (I/O) data port(s) 214 that also communicate with the processor 208. The storage system 210 may include removable and/or fixed media, such as floppy disks, ZIP drives, hard disks, or the like, as well as virtual storage, such as a RAMDISK. The I/O data port(s) 214 may be used to transfer information between the data processing system 200 and another computer system or a network (e.g., the Internet). These components may be conventional components, such as those used in many conventional computing devices, and their functionality, with respect to conventional operations, is generally known to those skilled in the art. The memory 206 may be configured with forced oscillation source location determination module 216 that may provide functionality that may include, but is not limited to, locating the geographic source of a forced oscillation event based on the mode angle analysis of the PMUs' 118a, 118b, and 118c measurements in accordance with some embodiments of the inventive concept.

Figure 3:
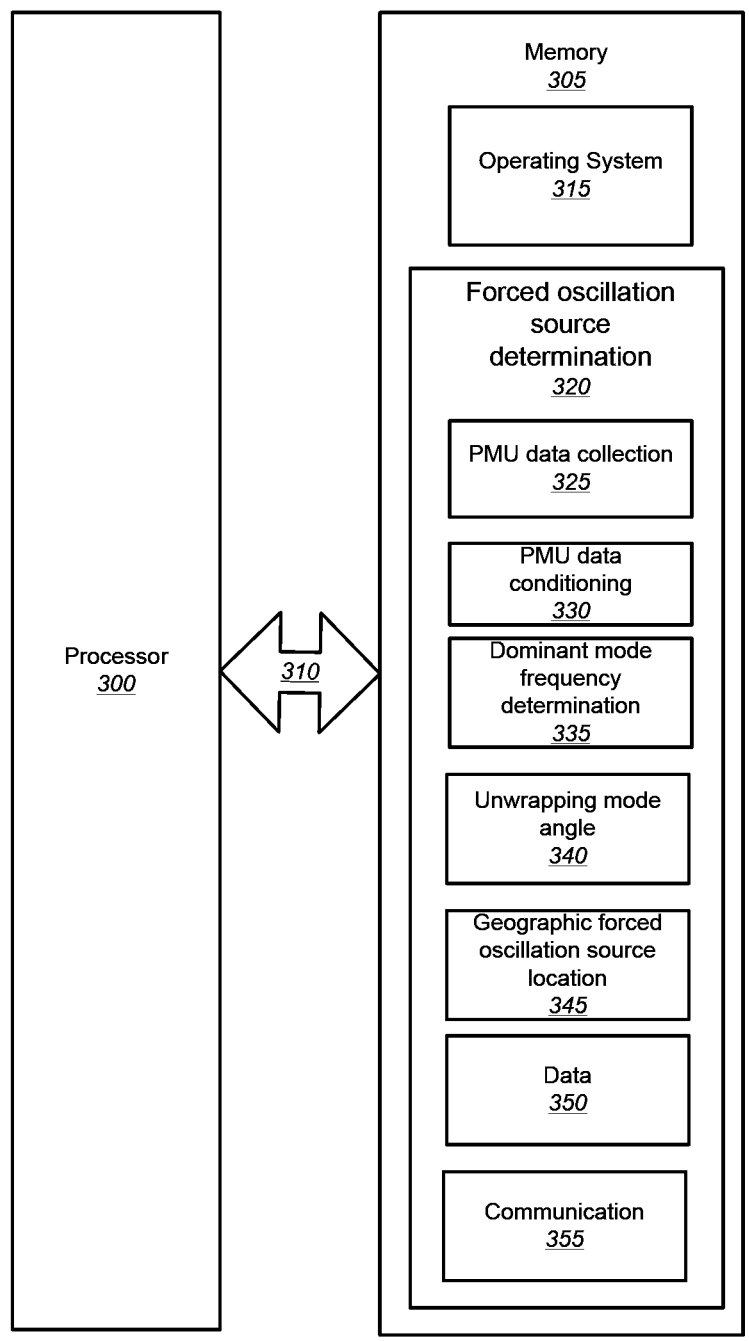
FIG. 3 is a block diagram that illustrates a software/hardware architecture for use in a DMS processor for determining the geographic source location of a forced oscillation event in accordance with some embodiments of the inventive concept.

FIG. 3 illustrates a processor 300 and memory 305 that may be used in embodiments of data processing systems, such as the DMS 114 processor of FIG. 1 and the data processing system 200 of FIG. 2, respectively, for detecting synchrophasor measurement timestamp time shifts, in accordance with some embodiments of the inventive concept. The processor 300 communicates with the memory 305 via an address/data bus 310. The processor 300 may be, for example, a commercially available or custom microprocessor. The memory 305 is representative of the one or more memory devices containing the software and data used for detecting synchrophasor measurement timestamp time shifts in accordance with some embodiments of the inventive concept. The memory 305 may include, but is not limited to, the following types of devices: cache, ROM, PROM, EPROM, EEPROM, flash, SRAM, and DRAM.

As shown in FIG. 3, the memory 305 may contain two or more categories of software and/or data: an operating system 315 and a forced oscillation source determination module 320. In particular, the operating system 315 may manage the data processing system's software and/or hardware resources and may coordinate execution of programs by the processor 300. The forced oscillation source determination module 320 may comprise a PMU data collection module 325, a PMU data conditioning module 330, a dominant mode frequency determination module 335, an unwrapping mode angle module 340, a geographic forced oscillation source location module 345, a data module 350, and a communication module 355.

The PMU data collection module 325 may be configured to receive measured information, such as, for example, time-stamped power system synchrophasor measurements from the PMUs 118a, 118b, and 118c in the distribution grid 110. Each of the synchrophasor measurements of a power system signal may include a phase angle, frequency value, and a timestamp associated with the synchrophasor measurement.

The PMU data conditioning module 330 may be configured to subtract a system median frequency value from the frequency value in each of the plurality of synchrophasor measurements to generate a detrended frequency value. The forced oscillation signal can be observed in both frequency and phase angle measurements of the power system signal. However, the trend frequency may be removed from the measurements to improve the mode analysis results. The system median frequency and system phase angle may be calculated for the detrending procedure.

For each time frame, a median frequency is obtained from the frequency measurements at different geographic areas, and the frequency series consisting of the median frequency is the system median frequency. The system median frequency may be subtracted from the frequency measurements of each PMU to remove the trend frequency. This is illustrated, for example, in FIGS. 9A and 9B, which are graphs of the original power system signal frequencies over time during a forced oscillation event and the detrended signal frequencies, respectively.

Figure 12B:
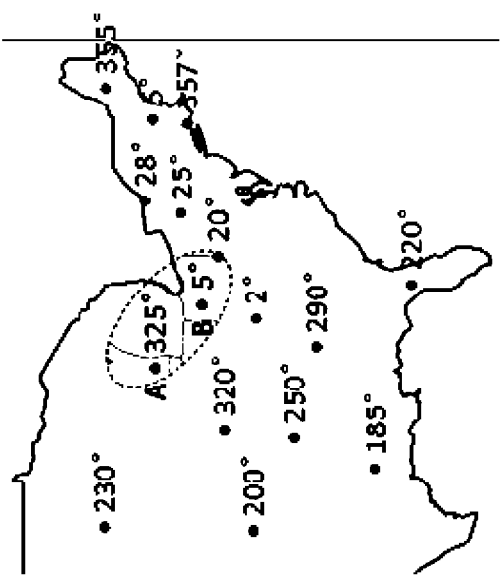
FIGS. 12A and 12B are maps that illustrates wrapped and unwrapped mode angles of forced oscillation signal components, respectively, in accordance with some embodiments of the inventive concept.
Figure 12A:
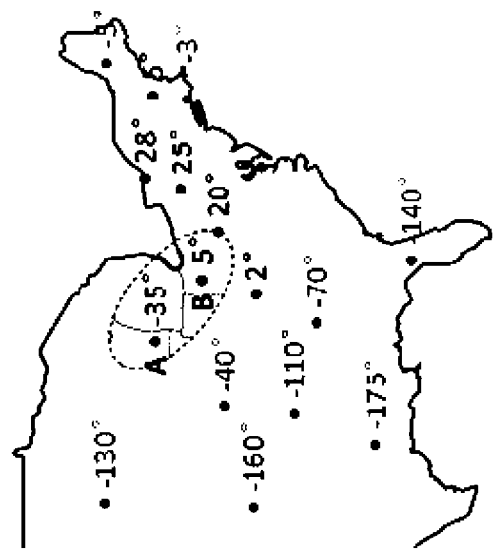

However, the mode angle obtained from Fourier analysis may be restricted within [0,2π), which may make it more difficult to identify the geographic location of the PMU with the most leading mode angle. Based on its geographic "continuity," the mode angle can be unwrapped. FIGS. 12A and 12B are maps that illustrate wrapped and unwrapped mode angles of forced oscillation signal components, respectively, in accordance with some embodiments of the inventive concept.

FIG. 12A shows a map of wrapped mode angles corresponding to PMUs in the eastern part of the United States during a forced oscillation event. As shown in FIG. 12A, the mode angles of PMU A and B are 325° and 5°, respectively. Considering the relatively small distance between the two PMUs, the mode angle of PMU A is unwrapped to −35°, as shown in FIG. 12B so that the mode angle of PMU A and B can be considered continuous. Instead of unwrapping the mode angle of PMU A, the mode angle of PMU B could be unwrapped to 365° to maintain the continuity. Regardless of which direction the mode angle unwrapped, the mode angle of PMU B is always ahead of the mode angle PMU A.

According to some embodiments of the inventive concept, the mode angles of the forced oscillation signal components of the various PMUs may be unwrapped using a Breadth First Search (BFS) methodology as set forth in the following pseudocode:

```
Collect all PMUs' data and perform PMU data conditioning;
Apply Fourier analysis to obtain mode angle of all PMUs;
Load GPS location of all PMUs, initial adjacency matrix of each PMU;
Choose any PMU (Ref) as the starting point;
Initialize a threshold for continuity testing;
Create a queue (CurrentPMUQueue);
Step A: Enqueue (Ref) into (CurrentPMUQueue);
        While: (CurrentPMUQueue) is NOT empty
                Dequeue PMU (X) from (CurrentPMUQueue);
                For each unprocessed adjacent PMU (i) of PMU (X)
                        If: PMU (i) can be unwrapped to maintain the mode angle continuity
                                Unwrap it and mark PMU (i) as processed;
                                Enqueue PMU (i) into (CurrentPMUQueue);
                        Else: Do nothing;
                End for each;
        End While;
        If: any PMU has not been processed
                Increase the threshold for continuity testing;
                        Jump to Step A;
        Else:   Exit;
```

Figure 10:
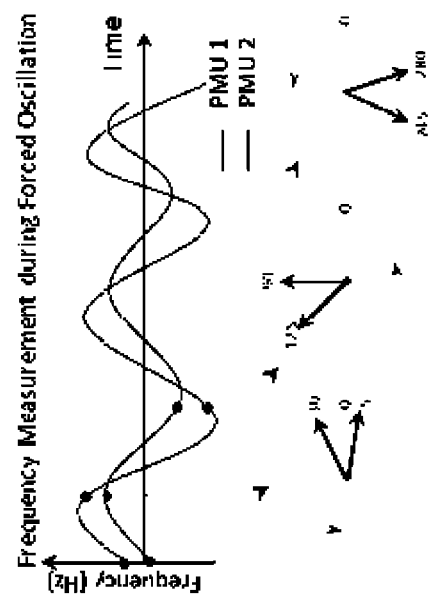
FIG. 10 is a graph that illustrates different mode angles between two forced oscillation signal components of a power signal associated with different Phasor Measurement Units (PMUs), respectively, in accordance with some embodiments of the inventive concept.

The dominant mode frequency determination module 335 may be configured to determine a dominant mode frequency of a forced oscillation signal component of the power system signal based on the frequency value and the phase angle. The forced signal component in a measurement series is a sinusoidal wave and the mode angle is the angle of the oscillating phasor at a specific time as shown in FIG. 10. A Fourier analysis may be performed on the detrended frequency and phase angle data to obtain the magnitude and mode angle of each oscillation component as shown in FIG. 11. The dominant mode frequency is the frequency at which the most PMUs reach the largest magnitude. The corresponding mode angle may likewise be obtained from the Fourier analysis.

The unwrapping mode angle module 340 may be configured to unwrap the mode angle of the forced oscillation signal component at the dominant mode frequency for each of the PMUs to generate an unwrapped mode angle. The mode angle may change gradually between adjacent areas.

Figure 13:
FIG. 13 is a map illustrating the distribution in mode angles of forced oscillation signal components for PMUs located in the eastern half of the United States in accordance with some embodiments of the inventive concept.

Once the mode angle unwrapping operations are complete, a map of the unwrapped the mode angle can be obtained, which illustrates the gradual changes in the mode angle over geographic distances. As shown in FIG. 13, PMUs in the north east region of the United States, specifically PMUs in the northwest portion of New York State into Canada have the most leading mode angle to demonstrate the gradually changing of mode angle while PMUs in the southeastern portion of the United States near Louisiana, Florida, Arkansas, and Mississippi have the most trailing mode angle.

The geographic source location module 345 may be configured to determine the geographic forced oscillation source location for a source of the forced oscillation signal component based on the mode angles associated with each of the PMUs and the geographic locations of the PMUs. In some embodiments, the geographic location of the source of the forced oscillation event may be determined to be the location of the PMU that has the most leading mode angle associated therewith relative to other ones of the PMUs. The accuracy of this geographic location determination, however, may be improved through application of a least squares regression analysis to the mode angles associated with PMUs in geographic proximity to the PMU associated with the most leading mode angle along with the rate of change of the mode angle with distance.

Around the source area of the forced oscillation event, the changing of mode angle may be proportional to its distance from the source. A least squares regression methodology may be applied to the unwrapped mode angle of the PMUs, which are located near the PMU with the most leading mode angle (i.e., initial determination of the source location of the forced oscillation event) to refine the source location estimation result.

Assuming the rate of change of the mode angle with distance is a constant, Equation 1 can be obtained:

$$(x_i-x_s)^2+(y_i-y_s)^2=V^2\cdot(A_i-A_s)^2 \quad (1)$$

where $x_i$, $y_i$ are the coordinate of $i^{th}$ PMU, $x_s$, $y_s$ are the coordinate of oscillation source, $A_i$ and $A_s$ are mode angle of $i^{th}$ PMU and oscillation source. V is the rate of change of the mode angle with distance. Because the number of PMUs is greater than the number of variables, it is an over-constrained equation. A linear system, in which the coordinates and mode angle of the source are variables to be obtained, may be generated so that the least-squares regression methodology can be used to solve the linear system.

By subtracting successive pairs of equations, a linear equation in terms of the source coordinates may be provided as Equation 2:

$$(x_{i+1}-x_i)x_s+(y_{i+1}-y_i)y_s-V^2(A_{i+1}-A_i)A_s=C_i \quad (2)$$

where $$C_i=\tfrac{1}{2}[x_{i+1}^2-x_i^2+y_{i+1}^2-y_i^2-V^2(A_{i+1}^2-A_i^2)) \quad (3)$$

Equation 3 for each of the PMUs can be written in matrix form as Equation 4:

$$HX=C \quad (4)$$

where $$X = \begin{bmatrix} x_s \\ y_s \\ A_s \end{bmatrix}, C = \begin{bmatrix} C_1 \\ C_2 \\ \vdots \\ C_n \end{bmatrix} \text{ and} \quad (5)$$

$$H = \begin{bmatrix} x_2 - x_1 & y_2 - y_1 & V^2(A_2 - A_1) \\ x_3 - x_2 & y_3 - y_2 & V^2(A_3 - A_2) \\ \vdots & \vdots & \vdots \\ x_n - x_{n-1} & y_n - y_{n-1} & V^2(A_n - A_{n-1}) \end{bmatrix}$$

Then the least squares regression output can be expressed as Equation 6:

$$X=(H^TH)^{-1}H^TC \quad (6)$$

The least squares regression analysis may provide improved accuracy with respect to the geographic location of the source of the forced oscillation event.

The data module 350 may represent the power system synchrophasor measurements from the PMUs 118a, 118b, and 118c and received by the PMU data collection module 325, for use by other modules of the forced oscillation source determination module 320 to determine the geographic source location of a forced oscillation event in accordance with some embodiments of the inventive concept.

The communication module 355 may be configured to facilitate communication between the DMS 114 processor and the PMUs 118a, 118b, and 118c of FIG. 1 over the network 120 and to facilitate communication of the geographic source location of a forced oscillation event and data and other information associated therewith to one or more entities.

Although FIG. 3 illustrates hardware/software architectures that may be used in data processing systems, such as the DMS 114 processor of FIG. 1 and the data processing system 200 of FIG. 2, respectively, for determining the geographic source location of a forced oscillation event in a power system network, in accordance with some embodiments of the inventive concept it will be understood that the present invention is not limited to such a configuration but is intended to encompass any configuration capable of carrying out operations described herein.

Computer program code for carrying out operations of data processing systems discussed above with respect to FIGS. 1-3 may be written in a high-level programming language, such as Python, Java, C, and/or C++, for development convenience. In addition, computer program code for carrying out operations of the present invention may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller.

Moreover, the functionality of the DMS 114 processor of FIG. 1, the data processing system 200 of FIG. 2, and the hardware/software architecture of FIG. 3, may each be implemented as a single processor system, a multi-processor system, a multi-core processor system, or even a network of stand-alone computer systems, in accordance with various embodiments of the inventive concept. Each of these processor/computer systems may be referred to as a "processor" or "data processing system."

The data processing apparatus of FIGS. 1-3 may be used to facilitate the determination of a geographic source location of a forced oscillation event in a power system network, according to various embodiments described herein. These apparatus may be embodied as one or more enterprise, application, personal, pervasive and/or embedded computer systems and/or apparatus that are operable to receive, transmit, process and store data using any suitable combination of software, firmware and/or hardware and that may be standalone or interconnected by any public and/or private, real and/or virtual, wired and/or wireless network including all or a portion of the global communication network known as the Internet, and may include various types of tangible, non-transitory computer readable media. In particular, the memory 206 coupled to the processor 208 and the memory 305 coupled to the processor 300 include computer readable program code that, when executed by the respective processors, causes the respective processors to perform operations including one or more of the operations described herein with respect to FIGS. 4-8, 9A-9B, 10, 11, 12A, 12B, and 13.

Figure 4:
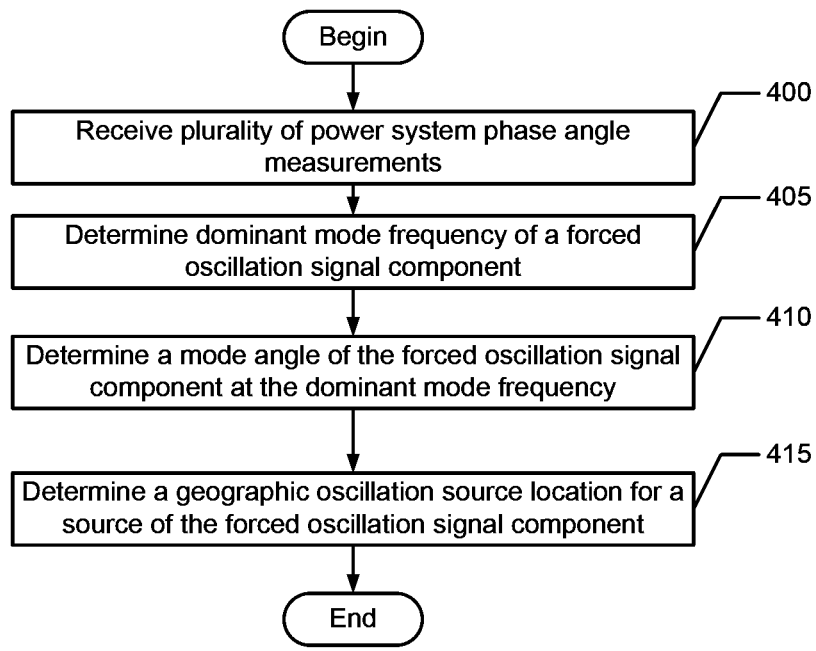
FIGS. 4-8 are flowcharts that illustrate operations for determining the geographic source location of a forced oscillation event in accordance with some embodiments of the inventive concept.
Figure 5:
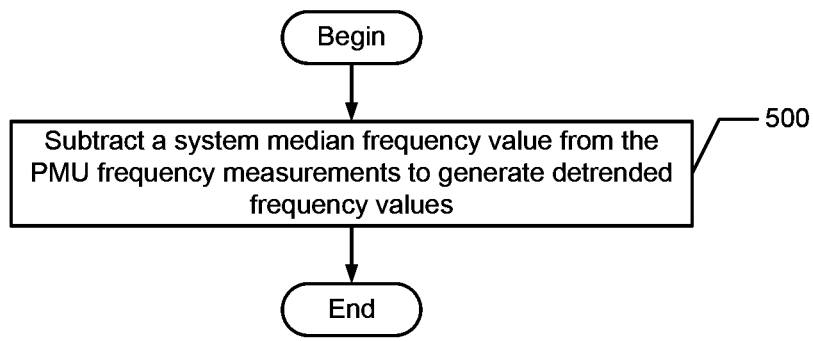
Figure 6:
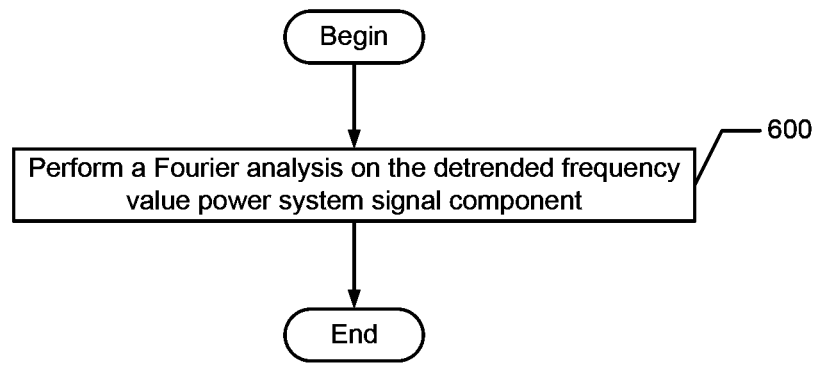
Figure 7:
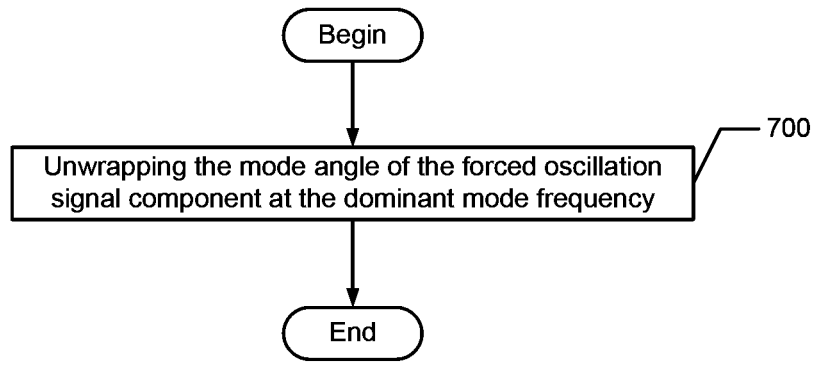

FIG. 4 is a flowchart that illustrates operations for determining a geographic location of a forced oscillation event in a power system network in accordance with some embodiments of the inventive concept. Operations begin at block 400 where the PMU data collection module 325 receives a plurality of power system synchrophasor measurements, which each include a phase angle, frequency value, and a timestamp. Referring to FIG. 5, the received synchrophasor data from the PMUs may be conditioned using the PMU data conditioning module 330 to subtract the system median frequency form the PMU frequency measurements to generate detrended frequency values at block 500. Referring now to FIG. 6, the dominant mode frequency determination module 335 may perform a Fourier analysis on the detrended frequency value power system signal component for each of the synchrophasor measurements at block 600. Returning to FIG. 4, the dominant mode frequency determination module 335 may determine, for each of the PMUs, the dominant mode frequency of the forced oscillation signal component of the power system based on the Fourier analysis at block 405 and may determine the mode angle of the forced oscillation signal component at the dominant mode frequency at block 410. Referring now to FIG. 7, the unwrapping mode angle module 340 may unwrap the mode angle of the forced oscillation signal component at the dominant mode frequency for each of the PMUs at block 700. Returning to FIG. 4, the geographic forced oscillation source location module 345 may determine the geographic forced oscillation source location for a source of the forced oscillation signal component based on the mode angles associated with the PMUs and the geographic locations of the PMUs at block 415.

Figure 8:
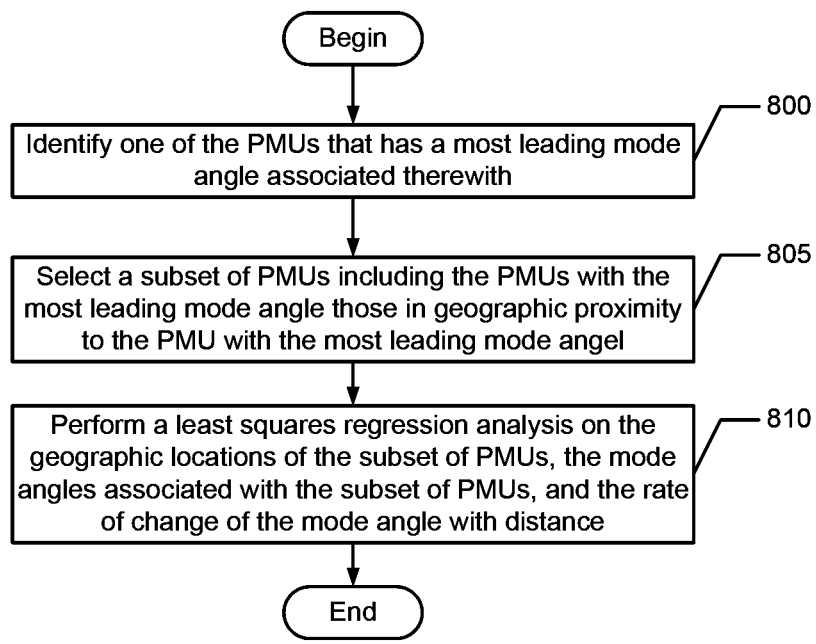

To improve the accuracy of the determination of the geographic source location of the forced oscillation event, a least squares regression analysis may be performed. Referring to FIG. 8, operations begin at block 800 where the one of the PMUs that has the most leading mode angle associated therewith is identified. A subset of PMUs in geographic proximity to the PMU with the most leading mode angle, including the PMU with the most leading mode angle, is selected at block 805. A least squares regression analysis is performed on the geographic locations of the subset of the PMUs along with the mode angles associated with the subset of the PMUs and a rate of change of the mode angle with distance at block 810. The geographic forced oscillation source location may then be determined based on the least squares analysis, which may target the source of the forced oscillation event more accurately.

Some embodiments of the inventive may provide a methodology for determining the geographic source location of a forced oscillation event in a power system network based on the mode angle associated with the forced oscillation signal component of the power system signal. Identification of the source of a forced oscillation event may allow operators of the power system to better investigate and determine potential causes of the event. As a result, actions may be taken with respect to the design and engineering of the power system to reduce the risk of further forced oscillation events and/or reduce their impact on power system's ability to deliver power reliably.

Further Definitions and Embodiments

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, LabVIEW, dynamic programming languages, such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular aspects only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like reference numbers signify like elements throughout the description of the figures.

The present disclosure of embodiments has been presented for purposes of illustration and description, but is not intended to be exhaustive or limited to the disclosure in the form disclosed. Many variations and modifications can be made to the embodiments without substantially departing from the principles of the present invention. All such variations and modifications are intended to be included herein within the scope of the present invention.

What is claimed is:

1. A method comprising:
performing by a processor:
receiving a plurality of synchrophasor measurements of a power system signal associated with a time interval from a plurality of phasor measurement units (PMUs), respectively, each of the plurality of synchrophasor measurements including a phase angle, frequency value, and a timestamp associated with the synchrophasor measurement;
subtracting a system median frequency value from the frequency value in each of the plurality of synchrophasor measurements to generate a detrended frequency value;
determining, for each of the plurality of PMUs, a dominant mode frequency of a forced oscillation signal component of the power system signal based on the detrended frequency value and the phase angle;
determining, for each of the plurality of PMUs, a mode angle of the forced oscillation signal component at the dominant mode frequency; and
determining a geographic forced oscillation source location for a source of the forced oscillation signal component based on the plurality of mode angles associated with each of the plurality of PMUs, respectively, and geographic locations of the plurality of PMUs.

2. The method of claim 1, wherein determining the geographic forced oscillation source location comprises:
identifying one of the plurality of PMUs that has a most leading mode angle associated therewith relative to other ones of the plurality of PMUs;
selecting a subset of the plurality of PMUs, the subset of the plurality of PMUs comprising the one of the plurality of PMUs that has the most leading mode angle and ones of the plurality of PMUs that are in geographic proximity to the one of the plurality of PMUs that has the most leading mode angle;
performing a least squares regression analysis on the geographic locations of the subset of the plurality of PMUs, the mode angles associated with each of the subset of the plurality of PMUs, and a rate of change of the mode angle with distance; and
determining the geographic forced oscillation source location based on the least squares regression analysis.

3. The method of claim 1, further comprising:
performing a Fourier analysis on the detrended frequency value power system signal component for each of the plurality of synchrophasor measurements;
wherein determining the dominant mode frequency of the forced oscillation signal component of the power system signal comprises:
determining, for each of the plurality of PMUs, the dominant mode frequency of the forced oscillation signal component of the power system signal based on the Fourier analysis.

4. The method of claim 3, wherein magnitudes of the forced oscillation signal components are greatest for a majority of ones of the plurality of PMUs at the dominant mode frequency.

5. The method of claim 1, further comprising:
unwrapping, for each of the plurality of PMUs, the mode angle of the forced oscillation signal component at the dominant mode frequency to generate an unwrapped mode angle;
wherein determining the geographic forced oscillation source location for the source of the forced oscillation signal component comprises:
determining the geographic forced oscillation source location for a source of the forced oscillation signal component based on the plurality of unwrapped mode angles associated with each of the plurality of PMUs, respectively, and geographic locations of the plurality of PMUs.

6. The method of claim 5, wherein unwrapping, for each of the plurality of PMUs, the mode angle of the forced oscillation signal component comprises maintaining mode angle continuity of the plurality of mode angles associated with each of the plurality of PMUs.

7. The method of claim 5, wherein unwrapping, for each of the plurality of PMUs, the mode angle of the forced oscillation signal component at the dominant mode frequency to generate the unwrapped mode angle comprises:
setting, for each of the plurality of PMUs for which the associated mode angle is a value between $\pi$ and $2\pi$, the unwrapped mode angle to a value between 0 and $-\pi$ corresponding to the value between $\pi$ and $2\pi$.

8. A system, comprising:
a processor; and
a memory coupled to the processor and comprising computer readable program code embodied in the memory that is executable by the processor to perform operations comprising:
receiving a plurality of synchrophasor measurements of a power system signal associated with a time interval from a plurality of phasor measurement units (PMUs), respectively, each of the plurality of synchrophasor measurements including a phase angle, frequency value, and a timestamp associated with the synchrophasor measurement;
subtracting a system median frequency value from the frequency value in each of the plurality of synchrophasor measurements to generate a detrended frequency value;
determining, for each of the plurality of PMUs, a dominant mode frequency of a forced oscillation signal component of the power system signal based on the detrended frequency value and the phase angle;
determining, for each of the plurality of PMUs, a mode angle of the forced oscillation signal component at the dominant mode frequency; and
determining a geographic forced oscillation source location for a source of the forced oscillation signal component based on the plurality of mode angles associated with each of the plurality of PMUs, respectively, and geographic locations of the plurality of PMUs.

9. The system of claim 8, wherein determining the geographic forced oscillation source location comprises:
identifying one of the plurality of PMUs that has a most leading mode angle associated therewith relative to other ones of the plurality of PMUs;
selecting a subset of the plurality of PMUs, the subset of the plurality of PMUs comprising the one of the plurality of PMUs that has the most leading mode angle and ones of the plurality of PMUs that are in geographic proximity to the one of the plurality of PMUs that has the most leading mode angle;
performing a least squares regression analysis on the geographic locations of the subset of the plurality of PMUs, the mode angles associated with each of the subset of the plurality of PMUs, and a rate of change of the mode angle with distance; and
determining the geographic forced oscillation source location based on the least squares regression analysis.

10. The system of claim 8, the operations further comprising:
performing a Fourier analysis on the detrended frequency value power system signal component for each of the plurality of synchrophasor measurements;
wherein determining the dominant mode frequency of the forced oscillation signal component of the power system signal comprises:
determining, for each of the plurality of PMUs, the dominant mode frequency of the forced oscillation signal component of the power system signal based on the Fourier analysis.

11. The system of claim 10, wherein magnitudes of the forced oscillation signal components are greatest for a majority of ones of the plurality of PMUs at the dominant mode frequency.

12. The system of claim 8, the operations further comprising:
unwrapping, for each of the plurality of PMUs, the mode angle of the forced oscillation signal component at the dominant mode frequency to generate an unwrapped mode angle;
wherein determining the geographic forced oscillation source location for the source of the forced oscillation signal component comprises:
determining the geographic forced oscillation source location for a source of the forced oscillation signal component based on the plurality of unwrapped mode angles associated with each of the plurality of PMUs, respectively, and geographic locations of the plurality of PMUs.

13. A computer program product, comprising:
a non-transitory computer readable storage medium comprising computer readable program code embodied in the medium that is executable by a processor to perform operations comprising:
receiving a plurality of synchrophasor measurements of a power system signal associated with a time interval from a plurality of phasor measurement units (PMUs), respectively, each of the plurality of synchrophasor measurements including a phase angle, frequency value, and a timestamp associated with the synchrophasor measurement;
subtracting a system median frequency value from the frequency value in each of the plurality of synchrophasor measurements to generate a detrended frequency value;
determining, for each of the plurality of PMUs, a dominant mode frequency of a forced oscillation signal component of the power system signal based on the detrended frequency value and the phase angle;
determining, for each of the plurality of PMUs, a mode angle of the forced oscillation signal component at the dominant mode frequency; and
determining a geographic forced oscillation source location for a source of the forced oscillation signal component based on the plurality of mode angles associated with each of the plurality of PMUs, respectively, and geographic locations of the plurality of PMUs.

14. The computer program product of claim 13, wherein determining the geographic forced oscillation source location comprises:
- identifying one of the plurality of PMUs that has a most leading mode angle associated therewith relative to other ones of the plurality of PMUs;
- selecting a subset of the plurality of PMUs, the subset of the plurality of PMUs comprising the one of the plurality of PMUs that has the most leading mode angle and ones of the plurality of PMUs that are in geographic proximity to the one of the plurality of PMUs that has the most leading mode angle;
- performing a least squares regression analysis on the geographic locations of the subset of the plurality of PMUs, the mode angles associated with each of the subset of the plurality of PMUs, and a rate of change of the mode angle with distance; and
- determining the geographic forced oscillation source location based on the least squares regression analysis.

15. The computer program product of claim 13, the operations further comprising:
- performing a Fourier analysis on the detrended frequency value power system signal component for each of the plurality of synchrophasor measurements;
- wherein determining the dominant mode frequency of the forced oscillation signal component of the power system signal comprises:
- determining, for each of the plurality of PMUs, the dominant mode frequency of the forced oscillation signal component of the power system signal based on the Fourier analysis.

16. The computer program product of claim 15, wherein magnitudes of the forced oscillation signal components are greatest for a majority of ones of the plurality of PMUs at the dominant mode frequency.

17. The computer program product of claim 13, the operations further comprising:
- unwrapping, for each of the plurality of PMUs, the mode angle of the forced oscillation signal component at the dominant mode frequency to generate an unwrapped mode angle;
- wherein determining the geographic forced oscillation source location for the source of the forced oscillation signal component comprises:
- determining the geographic forced oscillation source location for a source of the forced oscillation signal component based on the plurality of unwrapped mode angles associated with each of the plurality of PMUs, respectively, and geographic locations of the plurality of PMUs.

* * * * *